US011757460B2

(12) United States Patent
Hayashi

(10) Patent No.: US 11,757,460 B2
(45) Date of Patent: Sep. 12, 2023

(54) ANALOG-TO-DIGITAL CONVERTER

(71) Applicant: SANKEN ELECTRIC CO., LTD., Niiza (JP)

(72) Inventor: Hideki Hayashi, Niiza (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 142 days.

(21) Appl. No.: 17/488,367

(22) Filed: Sep. 29, 2021

(65) Prior Publication Data

US 2022/0149852 A1 May 12, 2022

Related U.S. Application Data

(63) Continuation of application No. PCT/JP2020/042169, filed on Nov. 12, 2020.

(51) Int. Cl.
*H03M 1/38* (2006.01)
*H03M 1/06* (2006.01)

(52) U.S. Cl.
CPC ................. *H03M 1/0604* (2013.01)

(58) Field of Classification Search
CPC ...... H03M 1/125; H03M 1/462; H03M 1/466; H03M 1/468; H03M 1/46; H03M 1/38; H03M 1/12; H03M 1/00; H03M 1/0692; H03M 1/0695; H03M 1/08; H03M 1/0863; H03M 1/1033; H03M 1/804; H03M 1/007; H03M 1/02; H03M 1/0607; H03M 1/0612; H03M 1/0624; H03M 1/069; H03M 1/0697; H03M 1/10; H03M 1/1004; H03M 1/1009; H03M 1/1023; H03M 1/1038; H03M 1/1047; H03M 1/1095; H03M 1/122; H03M 1/1225; H03M 1/124; H03M 1/1245; H03M 1/14; H03M 1/144; H03M 1/188

(Continued)

(56) References Cited

U.S. PATENT DOCUMENTS 8,786,483 B1 * 7/2014 Thompson .......... H03M 1/0836
341/161
8,957,802 B1 * 2/2015 Evans ................. H03M 1/0863
341/161

(Continued)

FOREIGN PATENT DOCUMENTS

JP        S51-15363 A    2/1976
JP        S61-98022 A    5/1986

(Continued)

*Primary Examiner* — Linh V Nguyen
(74) *Attorney, Agent, or Firm* — METROLEX IP LAW GROUP, PLLC

(57) ABSTRACT

An analog-to-digital converter according to one or more embodiments is disclosed that converts an analog input to a digital converted value by repeating a conversion data generation operation by a conversion data generator, a potential generation operation by a capacitance DAC, and a comparison operation by a comparator for a resolution bit, the analog-to-digital converter. a comparator operation signal generation circuit predicts the time when a potential generated by the capacitance DAC becomes settled based on a charging or discharging time to a capacitance element whose characteristics are equal to those of the capacitance used in the capacitance DAC, and generates a comparator operation signal to allow the comparator to start the comparison operation.

11 Claims, 8 Drawing Sheets

(58) Field of Classification Search
USPC .................................. 341/118, 120, 155, 172
See application file for complete search history.

(56) References Cited

U.S. PATENT DOCUMENTS

| | | | |
|---|---|---|---|
| 9,509,329 B2* | 11/2016 | Baek | H03K 5/134 |
| 9,614,540 B1* | 4/2017 | Kull | H03M 1/125 |
| 9,621,179 B1* | 4/2017 | Maulik | H03M 1/0863 |
| 10,291,251 B1* | 5/2019 | Innocent | H03M 1/46 |
| 10,454,492 B1* | 10/2019 | Shikata | H03M 1/466 |
| 11,271,577 B1* | 3/2022 | Hu | H03M 1/125 |
| 11,387,838 B1* | 7/2022 | Dyer | H03M 1/1033 |
| 2010/0013693 A1 | 1/2010 | Kuramochi et al. | |
| 2012/0026023 A1 | 2/2012 | Inoue | |
| 2015/0061913 A1* | 3/2015 | Wang | H03M 1/38 |
| | | | 341/172 |
| 2017/0093418 A1* | 3/2017 | Baek | H03M 1/124 |
| 2019/0074845 A1* | 3/2019 | Nakamura | H03M 1/462 |

FOREIGN PATENT DOCUMENTS

| | | |
|---|---|---|
| JP | S62-133821 A | 6/1987 |
| JP | H5-122076 A | 5/1993 |
| JP | H8-116258 A | 5/1996 |
| JP | 2001-267925 A | 9/2001 |
| JP | 2010-245927 A | 10/2010 |
| JP | 2011-199443 A | 10/2011 |
| WO | 2010/010661 A1 | 1/2010 |

* cited by examiner

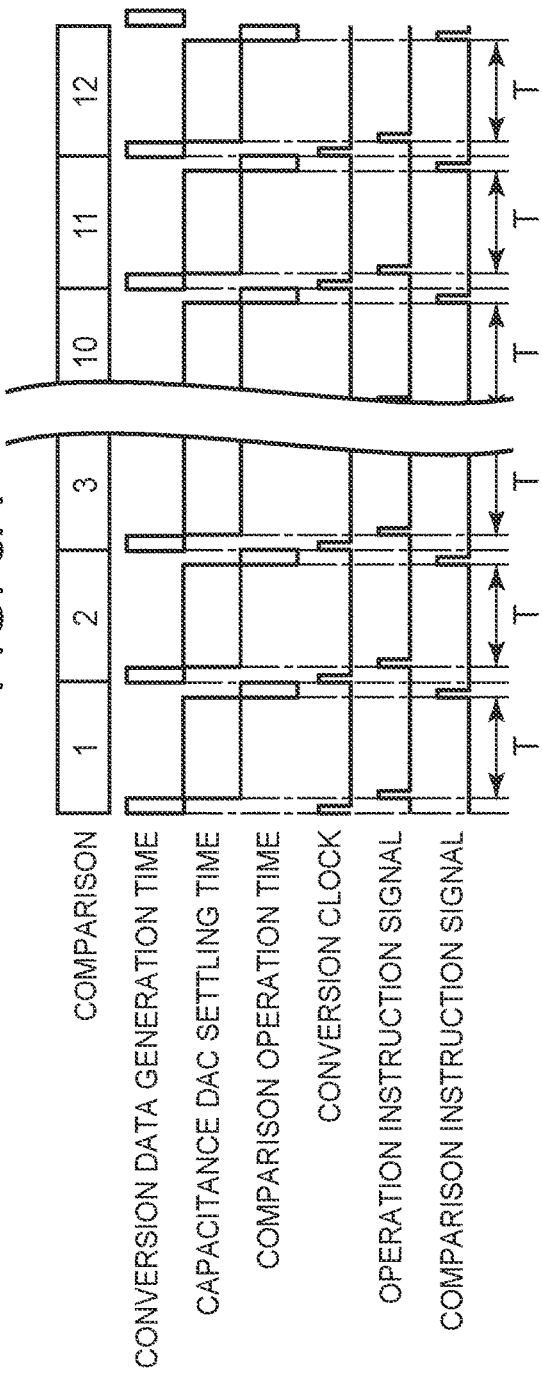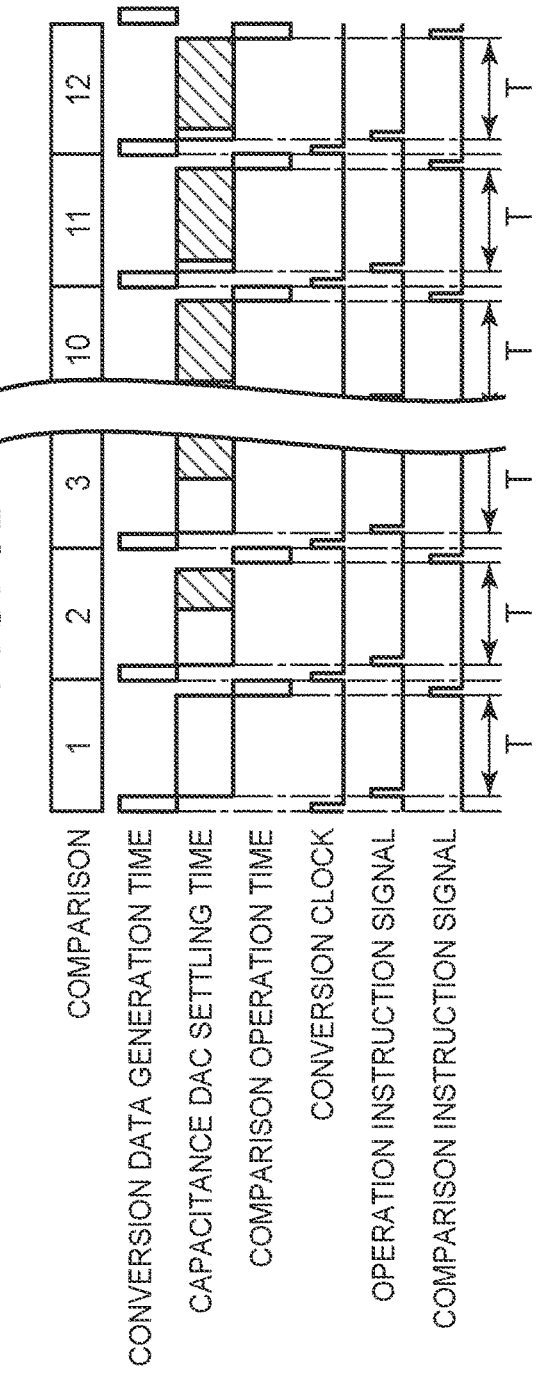

ANALOG-TO-DIGITAL CONVERTER

CROSS REFERENCE TO RELATED APPLICATIONS

This application is a continuation application of International Application No. PCT/JP2020/042169, filed on Nov. 12, 2020, the entire contents of which are incorporated herein by reference.

BACKGROUND

The disclosure relates to an analog-to-digital converter (hereinafter referred to as an A/D converter), in particular, to a successive approximation type A/D converter.

An A/D converter is a device that "quantifies" the input analog "voltage" for the purpose of performing digital processing, and a successive approximation type is often used because of its good balance of high speed, dimensions, and power consumption.

A successive approximation type A/D converter 1, referring to FIG. 7, compares an electric potential (hereinafter, may be referred simply to as "potential") generated by a capacitance DAC 2 based on the analog input electric potential with a comparator 3, feeds back the result to a conversion data generator 4, and conveys the approximate data candidate to the capacitance DAC 2. This process is repeated for resolution bits (n bits: n times) to obtain a digital converted value.

Capacitances $C_0$ to $C_{(n-1)}$ of the capacitance DAC 2 are weighted as $2^{(n-1)}$ for the bit(n-1) to be switched. The settling time for each bit until the capacitance DAC 2 reaches the target level is in proportion to the amount of change in the output potential, the amount of change in the output potential is in proportion to the amount of electric charge charged and discharged to the capacitances $C_0$ to $C_{(n-1)}$, and the amount of electric charge charged and discharged to the capacitances $C_0$ to $C_{(n-1)}$ is in proportion to the capacity of the bit to be switched. Therefore, the settling time of the capacitance DAC 2 is not uniform with the bit to be switched.

When the resolution of the successive approximation type A/D converter 1 is (n) bit, in order to obtain a digital value from one analog value, a conversion data generation operation operated by the conversion data generator 4 [conversion data generation time], a potential generation operation operated by the capacitance DAC 2 [capacitance DAC settling time], and a comparison operation operated by the comparator 3 [comparison operation time]} are repeated n times, and finally the conversion data generation operation [conversion data generation time] operated by the conversion data generator 4 is performed.

Therefore, the conversion time is expressed as the following equation:

Conversion time={[conversion data generation time]+[capacitance *DAC* settling time]+[comparison operation time]}×*n* (times)+[conversion data generation time].

When the above-mentioned operation is controlled using a conversion clock with equal intervals, as illustrated in FIG. 8A, the [capacitance DAC settling time] allocated to the potential generation operation operated by the capacitance DAC 2 is set to the same time T from the upper bit to the lower bit, assuming the case in which the settling time for each bit is the longest. FIG. 8A and FIG. 8B illustrate an example with 12-bit resolution.

In practice, however, the settling time in the capacitance DAC 2 is not uniform for the bit to be switched, and the settling time in the capacitance DAC 2 tends to become shorter as the bit becomes lower. Therefore, the wasted time illustrated in shaded lines in FIG. 8B is allocated as the [capacitance DAC settling time], which prevents the A/D converter 1 from achieving higher speed.

The technology of making a conversion clock when determining the lower bits faster than a conversion clock when determining the higher bits has already been proposed (e.g., Patent Document 1: JPS62-133821A (hereinafter referred to as Patent Document 1), and Patent Document 2: JPS51-015363A (hereinafter referred to as Patent Document 2).

However, in Patent Documents 1 and 2, a conversion clock is changed using a shift register and a counter, and the fact that the settling time of the capacitance DAC 2 changes due to changes in the capacitance value caused by process factors is not considered. Therefore, it is necessary to set the period of a conversion clock with a sufficient margin to cover the assumed amount of change in the capacitance value, and this margin results in an excessive allocation of the [capacitance DAC settling time].

SUMMARY

An analog-to-digital converter according to one or more embodiments is disclosed that converts an analog input to a digital converted value by repeating a conversion data generation operation by a conversion data generator, a potential generation operation by a capacitance DAC, and a comparison operation by a comparator for a resolution bit, the analog-to-digital converter. a comparator operation signal generation circuit predicts the time when a potential generated by the capacitance DAC becomes settled based on a charging or discharging time to a capacitance element whose characteristics are equal to those of the capacitance used in the capacitance DAC, and generates a comparator operation signal to allow the comparator to start the comparison operation.

An analog-to-digital converter according one or more embodiments may include a capacitance DAC comprising a capacitance and switches, the capacitance DAC receiving an analog input potential, a first reference potential, and a second reference potential, and generating a comparison potential; a comparator that compares the comparison potential generated by the capacitance DAC with a reference potential, and outputs a comparison result signal according to a comparison operation signal; a conversion data generator that receives the comparison signal output by the comparator, and generates a conversion data; and a comparator operation signal generation circuit. The comparator operation signal generation circuit may include a capacitance element whose characteristics are substantially equal to the capacitance of the capacitance DAC; an injection potential output unit that outputs one of injection potentials based on a charge/discharge instruction signal; a potential switching circuit that switches and outputs one of the injection potentials based on a charge/discharge instruction signal; a charge/discharge switch controlling charging and discharging the potential output by the potential switching circuit to the capacitance element; and an inverter circuit that outputs the comparison operation signal in response to the detection of charging and discharging of the capacitance element.

BRIEF DESCRIPTION OF DRAWINGS

FIGS. 8A and 8B are diagrams illustrating operations of a related A/D converter.

DETAILED DESCRIPTION

A/D converters according to one or more embodiments are described below based on the drawings. In the embodiments, configurations illustrating similar functions are marked with the same signs, and descriptions of the configurations are omitted accordingly.

Figure 1:
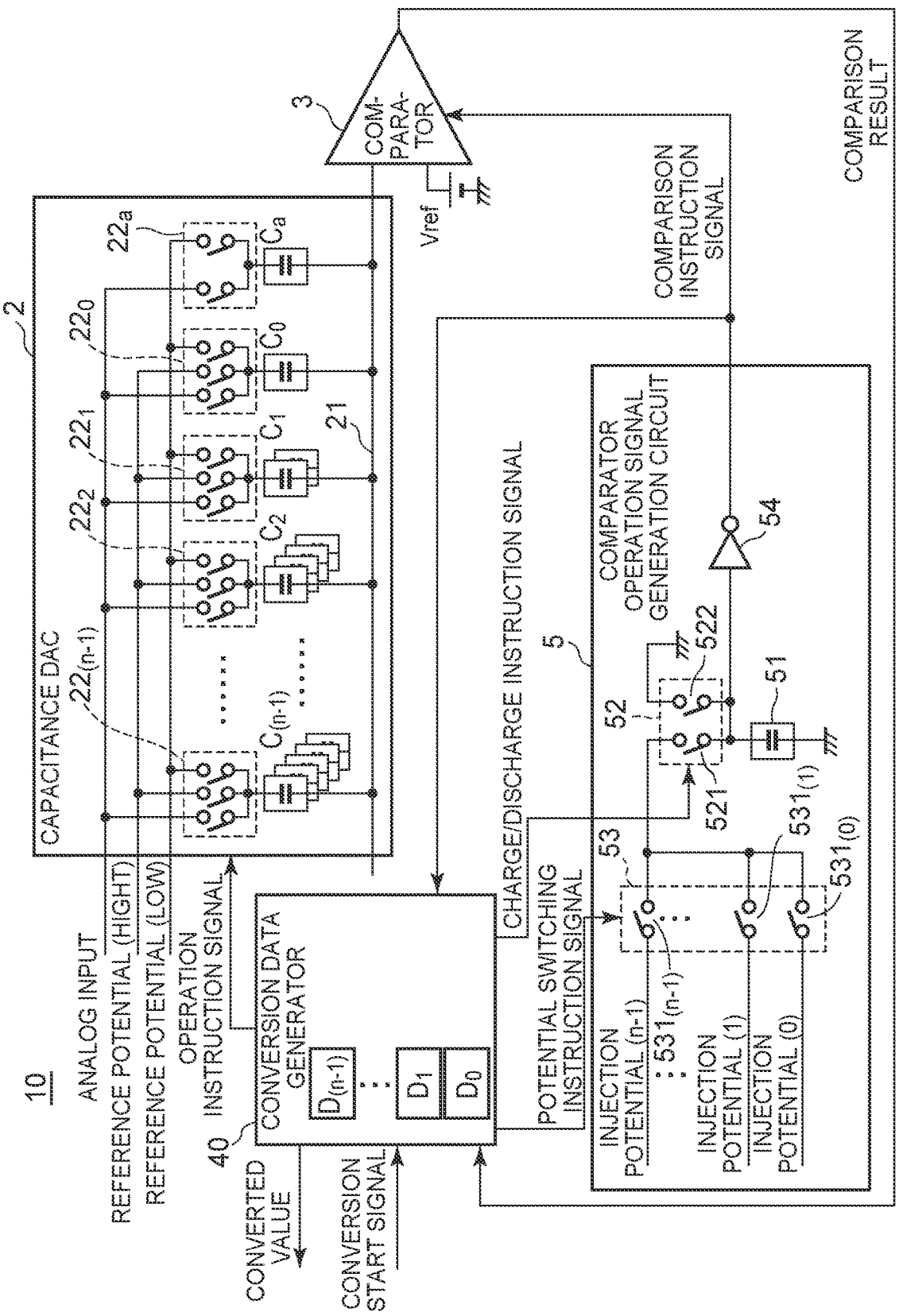
FIG. 1 is a block diagram illustrating a configuration of a first embodiment of an A/D converter related to one or more embodiments.

An A/D converter 10 may include a successive approximation type A/D converter. According to FIG. 1, the A/D converter 10 includes a capacitance DAC 2, a comparator 3, a conversion data generator 40, and a comparator operation signal generation circuit 5.

The A/D converter 10 compares electric potentials generated by the capacitance DAC 2 based on analog input potentials with the comparator 3. The result of the comparison is fed back to the conversion data generator 40, which conveys the approximate data candidates to the capacitance DAC 2. This process is repeated for a resolution bit (n bits: n times) to obtain a digital converted value.

In the capacitance DAC 2, one ends of each capacitance $C_0$ to $C_{(n-1)}$, which are weighted as $2^{(n-1)}$ for a switched bit(n−1), are connected to a common comparison wiring 21, and the comparison potential of the comparison wiring 21 is compared with a reference potential Vref by the comparator 3. The other ends of each capacitance $C_0$ to $C_{(n-1)}$ are connected to a reference potential. Switches $22_0$ to $22_{(n-1)}$ receive an analog input (potential), a reference potential (Hight), or a reference potential (Low) and outputs one of the analog input (potential), the reference potential (Hight), and the reference potential (Low) that were received. Note that a capacitance $C_a$ is a dummy capacitor with a capacitance $C_0$ capacitance value, and one end of the capacitance $C_a$ is connected to the comparison wiring 21, and the other end of the capacitance $C_a$ is connected to either the analog input (potential) or the reference potential (Low) via a switch 22a, after one of which is selected.

In the capacitance DAC 2, one of the capacitances $C_0$ to $C_{(n-1)}$ is connected to the reference potential (Hight) or the reference potential (Low) via the switches $22_0$ to $22_{(n-1)}$, respectively, according to the bit to be switched to reach the target level. Therefore, the time for charging the capacitances $C_0$ to $C_{(n-1)}$ to the reference potential (Hight) or discharging the capacitances $C_0$ to $C_{(n-1)}$ to the reference potential (Low) via the switches $22_0$ to $22_{(n-1)}$ is the settling time.

The comparator operation signal generation circuit 5 predicts a time at which the potential generated by the capacitance DAC 2 becomes settled based on the conversion data generated by the conversion data generator 40, and generates a comparator operation signal that causes the comparator 3 to start a comparison operation.

The comparator operation signal generation circuit 5 includes a capacitance element 51 whose characteristics are equal to those of the capacitances $C_0$ to $C_{(n-1)}$ used in the capacitance DAC 2, a charge/discharge switch 52 to the capacitance element 51, a potential switching circuit 53 that switches the potential to be charged to the capacitance element 51, and an inverter circuit 54 that outputs a comparison start signal when the potential of the capacitance element 51 is below the threshold potential.

The capacitance element 51 has one end connected to a ground terminal and the other end connected to both an input terminal of the inverter circuit 54 and one end of the charge/discharge switch 52. The charge/discharge switch 52 includes a charge switch 521 connecting the other end of the capacitance element 51 to the one end of the potential switching circuit 53 and a discharge switch 522 connecting the other end of the capacitance element 51 to a ground terminal. The charge switch 521 and the discharge switch 522 are turned on/off by the charge/discharge instruction signal from the conversion data generator 40. For example, when the charge/discharge instruction signal is Low, the charge switch 521 is controlled to be on and the discharge switch 522 is controlled to be off; and when the charge/discharge instruction signal is High, the charge switch 521 is controlled to be off and the discharge switch 522 is controlled to be on.

The discharge switch 522 is used, which has an on-resistance equivalent to the on-resistance of the switches $22_0$ to $22_{(n-1)}$ when the capacitances $C_0$ to $C_{(n-1)}$ are connected to the reference potential (Hight) or the reference potential (Low). The charge switch 521 is used with an on-resistance lower than that of the discharge switch 522 to support quick charging.

The potential switching circuit 53 includes n connection switches $531_{(n-1)}$ to $531_{(0)}$ for resolution bits that connect the other end of the capacitance element 51 to n injection potentials (n−1) to injection potentials (0) for resolution bits, respectively. The potential switching circuit 53 selects the injection potential to inject (charge) the charge into the capacitance element 51 from the injection potentials (n−1) to the injection potentials (0) by the potential switching instruction signal from the data generator 40 to switch switches.

The injection potential (n−1) to injection potential (0) are potentials for simulating the amount of charge to be injected into or discharged from the capacitance DAC 2, and upon discharge from the capacitance element 51, the time until the threshold potential of the inverter circuit 54 is reached is set to the maximum value of the settling time (the reference potential by charging) for each the most significant to the least significant bit.

Figure 2:
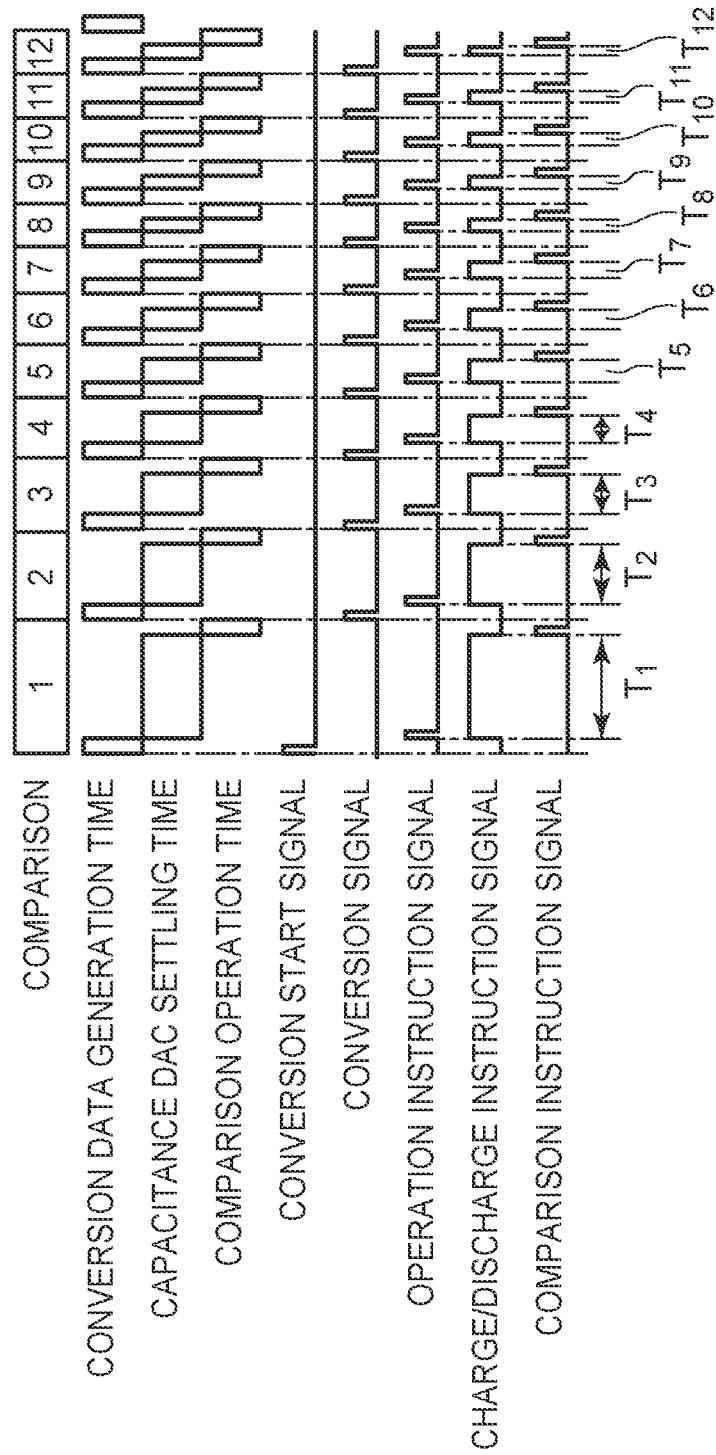
FIG. 2 is an explanatory diagram illustrating an operation of an A/D converter such as is illustrated in FIG. 1.

An operation of the A/D converter 10 is described in detail with reference to FIG. 2. The conversion data generator 40 instructs the potential switching circuit 53 of the comparator operation signal generation circuit 5 to connect to the injection potential (n−1) corresponding to the most significant bit by the potential switching instruction signal. The conversion data generator 40 also sets the charge/discharge instruction signal to Low to charge the capacitance element 51 to the injection potential (n−1), and starts a conversion data generation operation when the conversion start signal is input.

The conversion data generator 40 outputs the most significant bit capacitance DAC input value to the capacitance DAC 2 at the time when the operation start signal, which is generated after a predetermined time from the conversion start signal is generated, is released (after the conversion data generation operation is completed). At the same time, the conversion data generator 40 instructs the comparator operation signal generation circuit 5 to shift the charge/discharge instruction signal to High and to discharge from the capacitance element 51.

The capacitance DAC 2 generates a potential for determining the most significant bit by a potential generation operation, and the comparator operation signal generation circuit 5 outputs a comparison start signal to the comparator 3 and the conversion data generator 40 when the injection potential (n−1) charged in the capacitance element 51 by discharge falls below the threshold potential of the inverter circuit. That is, the comparator operation signal generation circuit 5 predicts the settling time of the capacitance DAC 2, which differs for each bit to be switched, using the capacitance element 51 whose characteristics are equal to those of the capacitance used in the capacitance DAC 2 and the injection potential (0) to the injection potential (n−1), and outputs the comparison start signal at the timing when the settling time ends.

By inputting the comparison start signal, the comparator 3 compares the potential generated by the potential generation operation of the capacitance DAC 2 with the reference potential, and outputs the comparison result to the conversion data generator 40. Also, by inputting the comparison start signal, the conversion data generator 40 instructs the potential switching circuit 53 of the comparator operation signal generation circuit 5 with the switching instruction signal to connect to the injection potential (n−2) corresponding to the next bit, and sets the charge/discharge instruction signal to Low to cause the capacitance element 51 to be charged. The conversion data generator 40 starts a conversion data generation operation to generate the conversion data $D_{(n-1)}$ of the most significant bit based on the comparison result of the comparator 3 at the time when the converted signal, which is generated after a predetermined time from the comparison start signal is generated, is released (after the end of the converter comparison operation).

The conversion data generator 40 outputs the capacitance DAC input value of the next bit based on the conversion data of the most significant bit (the comparison result of the comparator 3) to the capacitance DAC 2 at the time when the operation start signal, which is generated after a predetermined time from the conversion start signal is generated, is released (after the conversion data generation operation is completed). At the same time, the conversion data generator 40 instructs the comparator operation signal generation circuit 5 to shift the charge/discharge instruction signal to High and to discharge from the capacitance element 51.

The capacitance DAC 2 generates a potential for determining the next bit by a potential generation operation. The comparator operation signal generation circuit 5 outputs a comparison start signal to the comparator 3 and the conversion data generator 40 when the potential of the capacitance element 51 falls below the threshold potential of the inverter circuit 54 by discharge.

By inputting the comparison start signal, the comparator 3 compares the potential generated by the potential generation operation of the capacitance DAC 2 with the reference potential, and outputs the comparison result to the conversion data generator 40. Also, by inputting the comparison start signal, the conversion data generator 40 instructs the potential switching circuit 53 of the comparator operation signal generation circuit 5 to connect to the injection potential (n−3) corresponding to the next bit by the switching instruction signal, and sets the charge/discharge instruction signal to Low to charge the capacitance element 51. The conversion data generator 40 starts a conversion data generation operation to generate a conversion data $D_{(n-2)}$ of the next bit based on the comparison result of the comparator 3 at the time when the conversion signal, which is generated after a predetermined time from the comparison start signal is generated, is released (after the end of the conversion comparison operation).

Hereafter, the above operation is repeated until the conversion data of the most significant bit is generated by repeating the comparison for the resolution bit (for 12 bits), and the conversion data generator 40 outputs the conversion data $D_{(n-1)}$ to $D_{(0)}$ as the converter value.

As a result, [capacitance DAC settling time intervals] $T_1$ to $T_{12}$ assigned to the potential generation operation by the capacitance DAC 2 are set to become shorter from the upper bit to the lower bit according to the settled intervals for each bit, which may achieve a higher speed. The lower the bit becomes, the shorter the settling time interval becomes, and the decrease range also becomes smaller. Accordingly, the plurality of lower bits set in advance may be made to correspond with the same injection potential.

Figure 3:
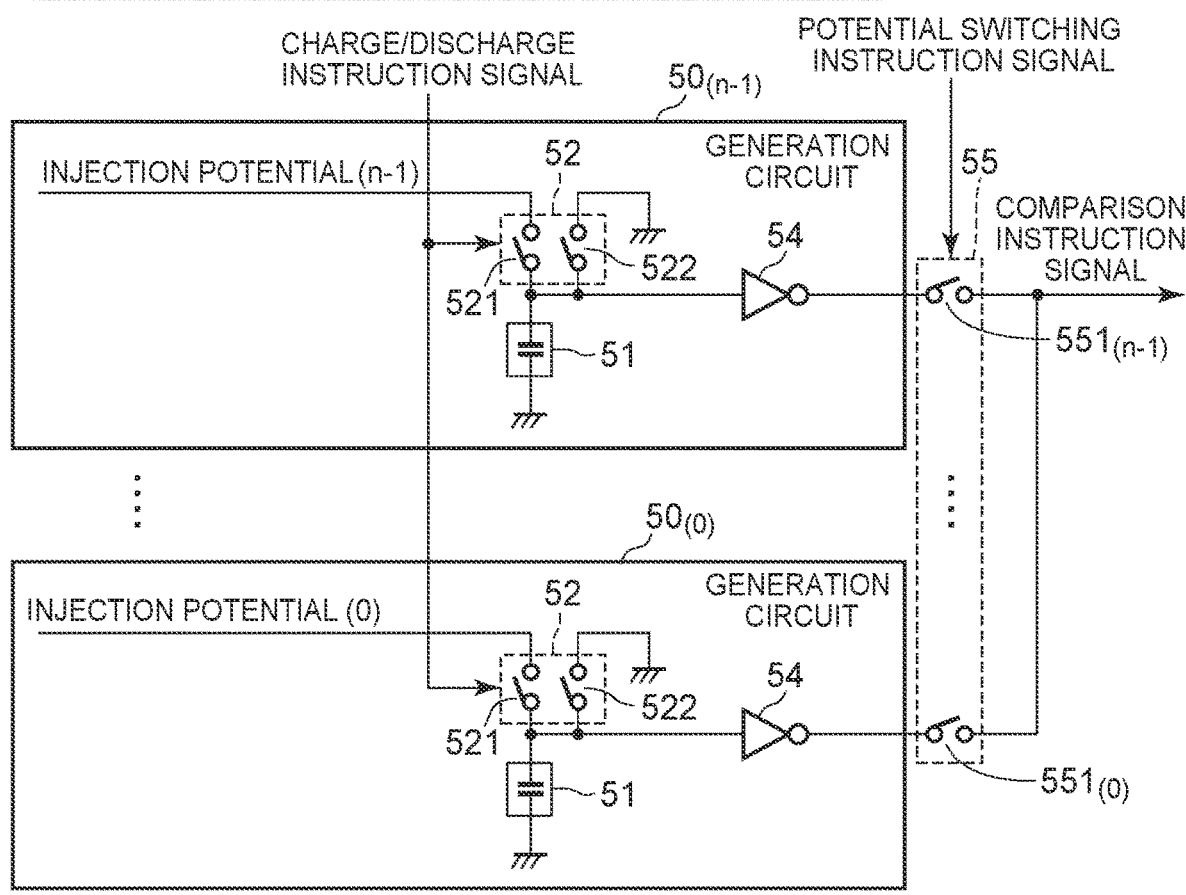
FIG. 3 is a diagram illustrating a first variation of a comparator operation signal generation circuit such as is illustrated in FIG. 1.

A first variant of the comparator operation signal generation circuit 5 is described in detail with reference to FIG. 3. Referring to FIG. 3, a comparator operation signal generation circuit 5a, which is a first variant example, includes a generation circuit $50_{(n-1)}$ to a generation circuit $50_{(0)}$ that predict the settling time of the capacitance DAC 2, which is different for each bit to be switched, and output a comparison start signal at the time when the settling time ends; an output switching circuit 55 that selects which comparison start signal of the generation circuit $50_{(n-1)}$ to the generation circuit $50_{(0)}$ is output.

Each of the generation circuits $50_{(n-1)}$ to $50_{(0)}$ includes the capacitance element 51, the charge/discharge switch 52, and the inverter circuit 54. Each of the capacitive elements 51 is connected to a ground terminal at one end, and the other end is connected to an input terminal of the inverter circuit 54 and one end of the charge/discharge switch 52.

The charge/discharge switch 52 of the generation circuits $50_{(n-1)}$ to $50_{(0)}$ includes the charge switch 521 that connects the other end of the capacitance element 51 with the injection potential (n−1) to the injection potential (0), respectively; and the discharge switch 522 that connects the other end of the capacitance element 51 with the ground terminal. The charge/discharge instruction signal from the conversion data generator 40 controls both the charge switch 521 and the discharge switch 522 to be on or off.

The output switching circuit 55 includes n connection switches $551_{(n-1)}$ to $551_{(0)}$ for resolution bits. The output switching circuit 55 switches after selecting one to output the comparison start signal from the generation circuit $50_{(n-1)}$ to the generation circuit $50_{(0)}$ with the output switching instruction signal from the conversion data generator 40.

In the comparator operation signal generation circuit 5a, when the charge/discharge switch 52 of the generation circuit $50_{(n-1)}$ to the generation circuit $50_{(0)}$ is configured to be individually switchable to discharge, the output switching circuit 55 may be omitted.

Figure 4:
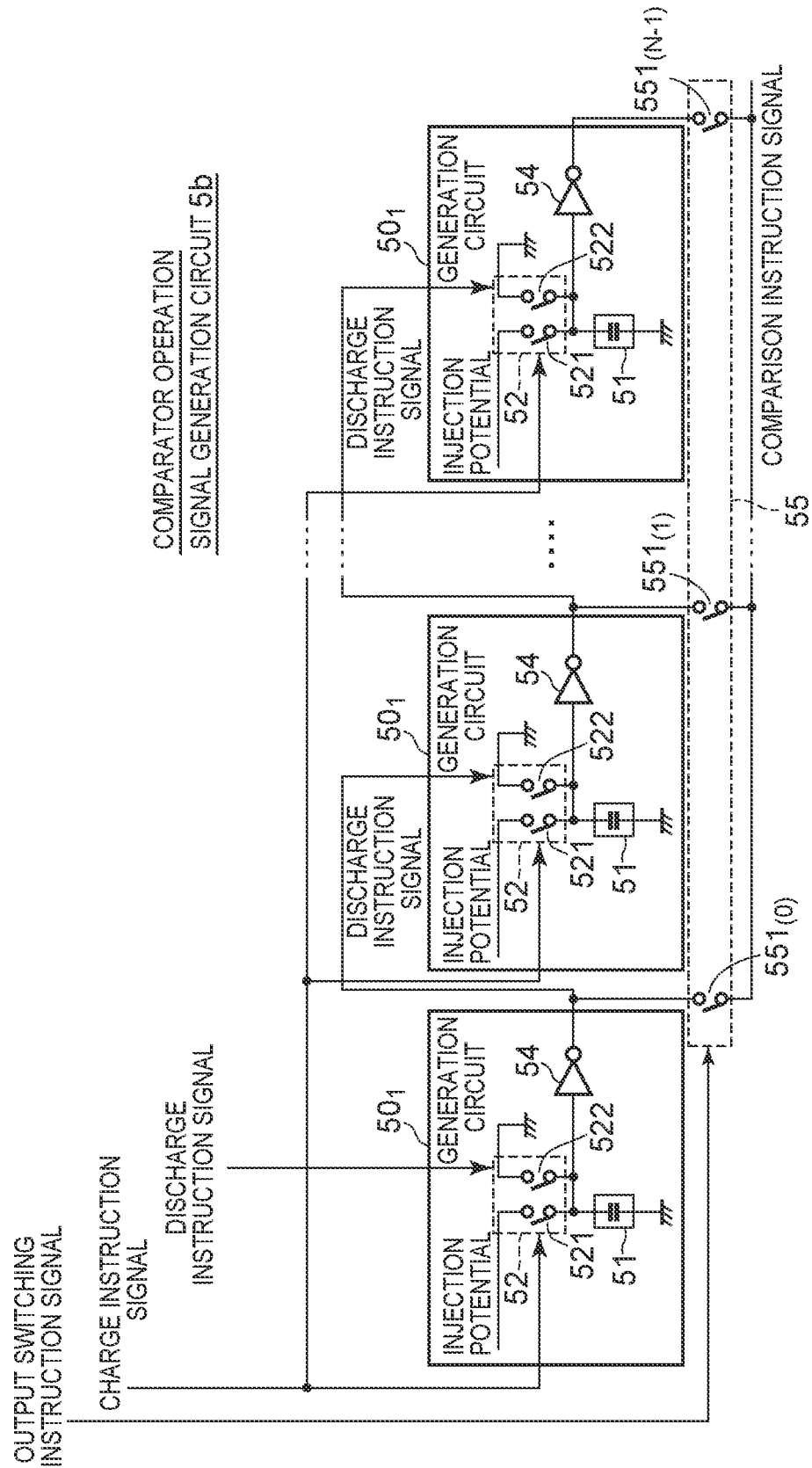
FIG. 4 is a diagram illustrating a second variation of a comparator operation signal generation circuit such as is illustrated in FIG. 1.

A second variant of the comparator operation signal generation circuit 5 is described in detail with reference to FIG. 4. Referring to FIG. 4, in a comparator operation signal generation circuit 5b, which is a second variant example, generation circuits $50_1$ that generate the timing of outputting a comparison start signal using the capacitance element 51 whose characteristics are equal to those of the capacitance used in the capacitive DAC 2 are connected in series with N stages, and includes the output switching circuit 55 that selects which comparison start signal is output to the comparator 3. Each of the N generation circuits $50_1$ includes the capacitance element 51, the charge/discharge switch 52, and the inverter circuit 54. The inverter circuit 54 is connected to the charge/discharge switch 52 of the next stage, in which a comparison start signal output from the inverter circuit 54 is input to the charge/discharge switch 52 of the next stage as a discharge instruction signal In the generation circuit $50_1$, the capacitance element 51 has one end connected to a ground terminal, and the other end connected to an input terminal of the inverter circuit 54 and one end of the charge/discharge switch 52. The charge/discharge switch 52 includes the charge switch 521 connecting the other end of the capacitance element 51 to the injection potential and the discharge switch 522 connecting the other end of the capacitance element 51 to the ground terminal. The charge/discharge switch 52, according to a charge instruction signal from the conversion data generator 40, turns the charge switch 521 to be on and the discharge switch 522 to be off and injects an electric charge to the capacitance element 51.

When a charge instruction signal is input from the conversion data generator 40 to the generation circuit $50_1$ of the first stage in the condition of charge injected into the capacitance elements 51 of all stages, the charge switch 521 is turned off and the discharge switch 522 is turned on in the generation circuit $50_1$ of the first stage to start discharging from the capacitance element 51. When the potential of the capacitance element 51 falls below the threshold potential of the inverter circuit 54 as a result of the discharge, a comparison start signal is output and is input to the charge/discharge switch 52 of the next stage as a discharge instruction signal.

As a result, by controlling the output switching circuit 55 (connection switches $551_{(n-1)}$ to $551_{(0)}$) and selecting the stage to be used for the discharge instruction signal, a second variant of the comparator operation signal generation circuit 5 illustrated in FIG. 4 may predict the settling time of the capacitance DAC 2, which is different for each bit to be switched, and may output the comparison start signal to the comparator 3 at the time when the settling time ends.

Figure 5:
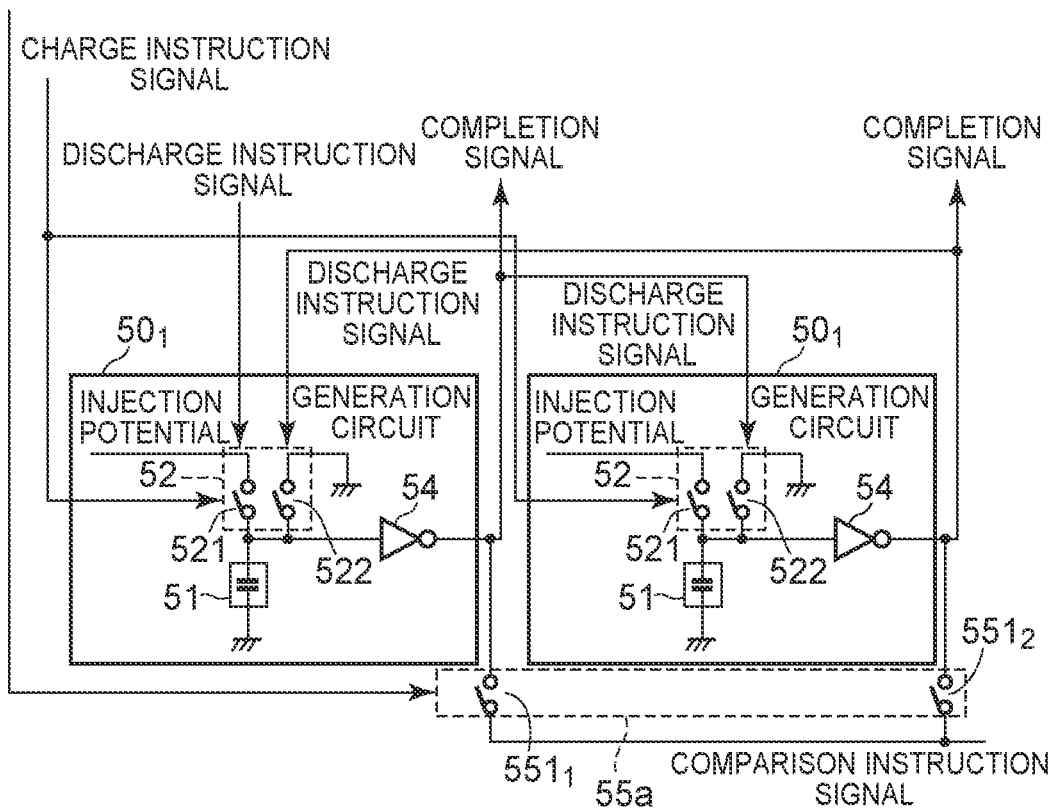
FIG. 5 is a diagram illustrating a third variation of a comparator operation signal generation circuit such as is illustrated in FIG. 1.

A third variant of the comparator operation signal generation circuit 5 is described in detail with reference to FIG. 5. Referring to FIG. 5, the comparator operation signal generation circuit 5c, which is a third variant example, includes a generation circuit $50_1$, which generates the timing to output a comparison start signal using a capacitance element 51 whose characteristics are equal to those of the capacitance used in the capacitive DAC 2, connected in two stages; and an output switching circuit 55a that selects which comparison start signal is output to the comparator 3. Each of the two-stage generation circuits $50_1$ includes the capacitance element 51, the charge/discharge switch 52, and the inverter circuit 54. The two-stage generation circuits $50_1$ are connected to be so that the comparison start signal output from the inverter circuit 54 is input to the charge/discharge switch 52 of the other stage as a discharge instruction signal.

In the generation circuit $50_1$, the capacitance element 51 has one end connected to a ground terminal, and the other end connected to an input terminal of the inverter circuit 54 and one end of the charge/discharge switch 52. The charge/discharge switch 52 includes the charge switch 521 connecting the other end of the capacitance element 51 to the injection potential, and the discharge switch 522 connecting the other end of the capacitance element 51 to the ground terminal. The charge/discharge switch 52 turns the charge switch 521 to be on and the discharge switch 522 to be off according to the charge instruction signal from the conversion data generator 40 to inject a charge to the capacitance element 51.

When a discharge instruction signal is input from the conversion data generator 40 to the generator circuit $50_1$ of the first stage in the condition of charge injected into the capacitance elements 51 of all stages, the charge switch 521 is turned off and the discharge switch 522 is turned on in the generator circuit $50_1$ of the first stage to start discharging from the capacitance element 51. When the potential of the capacitance element 51 falls below the threshold potential of the inverter circuit 54 as a result of the discharge, a comparison start signal is output. The comparison start signal output from the generation circuit $50_1$ of the first stage is input to the charge/discharge switch 52 in the generation circuit $50_1$ of the second stage as a discharge instruction signal, and is also input to the conversion data generator 40 as a completion signal.

As a result, in the generation circuit $50_1$ of the second stage, the charge switch 521 is turned off and the discharge switch 522 is turned on to start discharging from the capacitance element 51, and the conversion data generator 40 outputs a charge instruction signal to the generation circuit $50_1$ of the first stage to start charging the capacitance element 51. When the potential of the capacitance element 51 in the generation circuit $50_1$ of the first stage falls below the threshold potential of the inverter circuit 54 due to the discharge, a comparison start signal is output and is input to the charge/discharge switch 52 in the generation circuit $50_1$ of the first stage as a discharge instruction signal and is also input to the conversion data generator 40 as a completion signal.

Hereafter, a comparison start signal is output at the time quantized by repetition, and the conversion data generator 40 outputs an output switching instruction signal to the output switching circuit 55 at a desired timing by counting the input completion signals, and turns on either of connection switches $551_1$ or $551_2$ of the output switching circuit 55 to output a comparison start signal to the comparator 3.

Therefore, a third variant of the comparator operation signal generation circuit 5 illustrated in FIG. 5 allows the two-stage generation circuit $50_1$ to predict each settling time of the capacitance DAC 2, which is different for each bit to be switched, and to output a comparison start signal to the comparator 3 at the time when the settling time ends.

Figure 6:
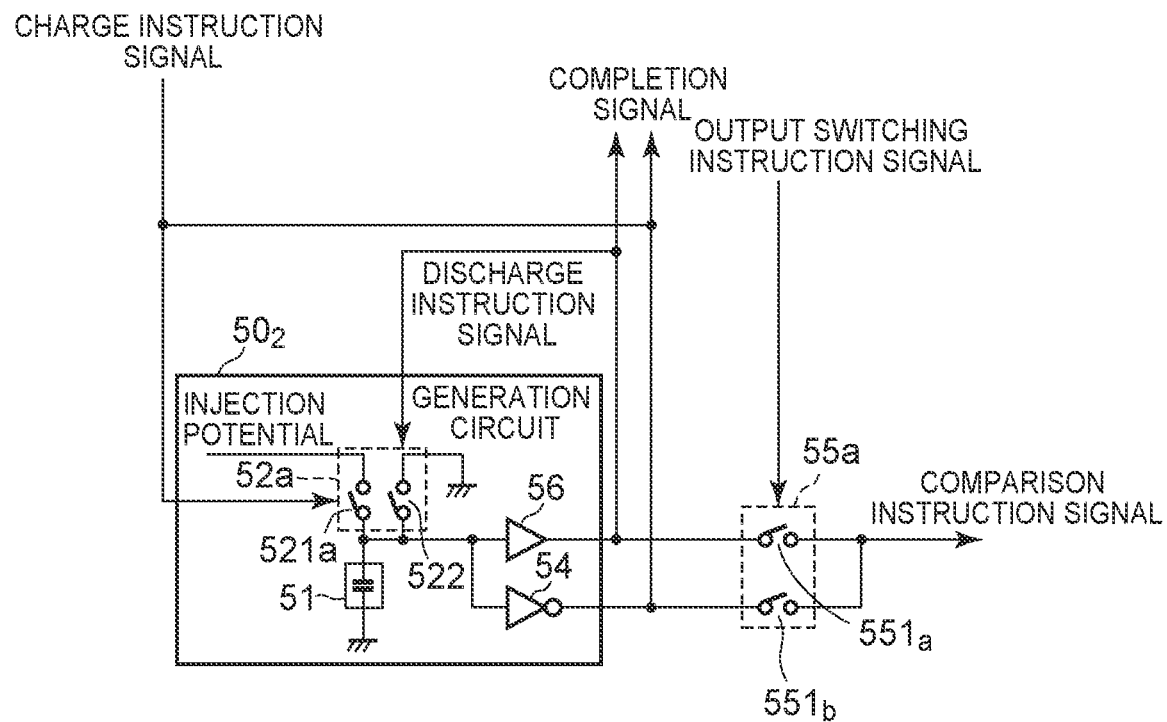
FIG. 6 is a diagram illustrating a fourth variation of a comparator operation signal generation circuit such as is illustrated in FIG. 1.
Figure 7:
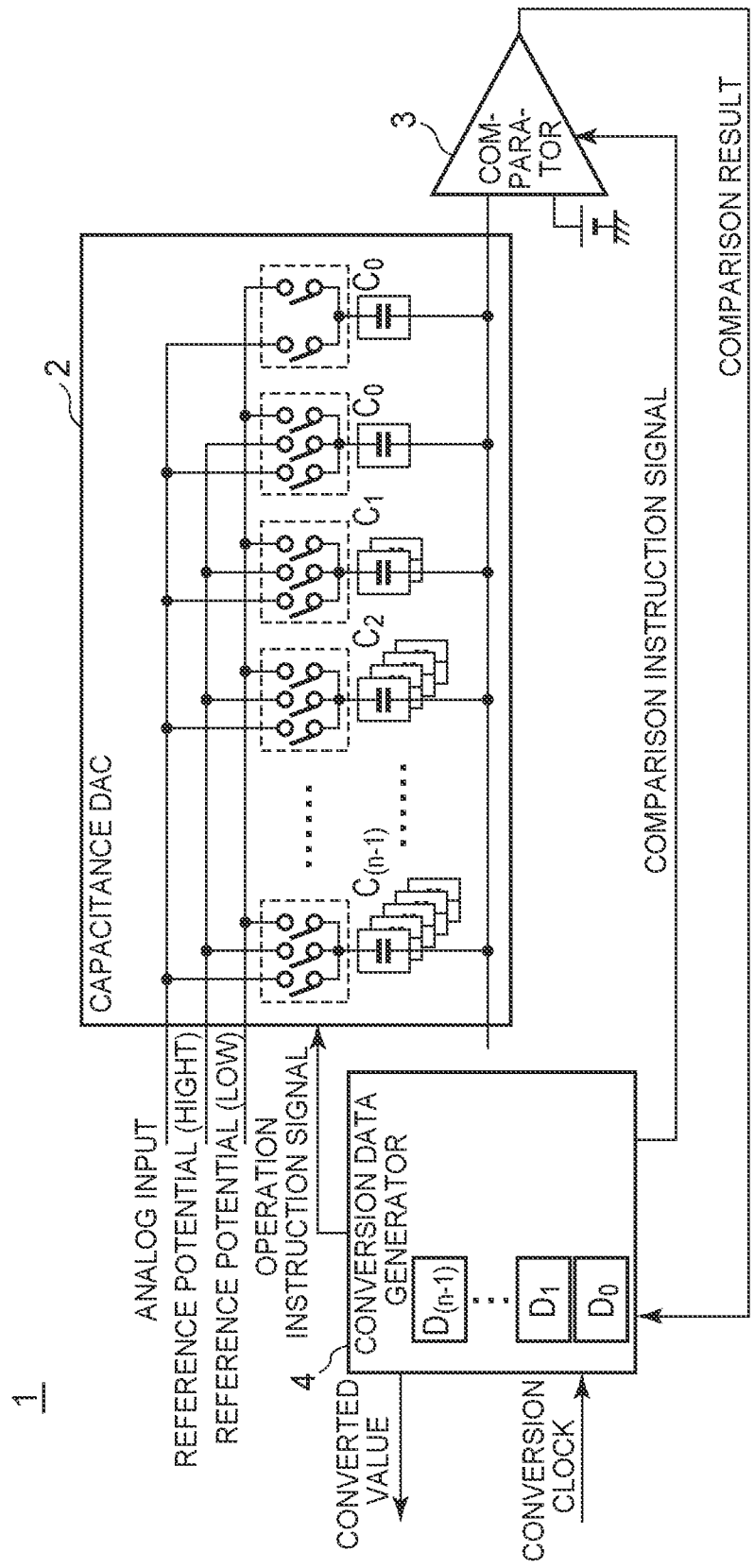
FIG. 7 is a diagram illustrating a configuration of a related A/D converter.

A fourth variation of the comparator operation signal generation circuit 5 is described in detail with reference to FIG. 6. Referring to FIG. 6, the comparator operation signal generation circuit 5d, which is a fourth variation example, includes a generation circuit 502 comprising the capacitance element 51, a charge/discharge switch 52a, the inverter circuit 54, and a buffer circuit 56 that outputs a comparison start signal when the potential of the capacitance element 51 exceeds the threshold potential, and an output switching circuit 55a that selects which comparison start signal from the inverter circuit 54 or the buffer circuit 56 is output to the comparator 3.

In the generation circuit 502, the capacitance element 51 has one end connected to a ground terminal, and the other end connected to an input terminal of the inverter circuit 54, an input terminal of the buffer circuit 56, and one end of the charge/discharge switch 52a. The charge/discharge switch 52a includes a charge switch 521a connecting the other end of the capacitance element 51 to each injection potential, and the discharge switch 522 connecting the other end of the capacitance element 51 to the ground terminal. The charge/discharge switch 52a turns the charge switch 521a to be on and the discharge switch 522 to be off according to the charge instruction signal, which is output from the conversion data generator 40 at the same time when the operation instruction signal is generated to the capacitance DAC 2, to inject a charge to the capacitance element 51.

The charge switch 521a and the discharge switch 522 are used, which has an on-resistance equivalent to the on-resistance of the switches $22_0$ to $22_{(n-1)}$ when the capacitances $C_0$ to $C_{(n-1)}$ are connected to the reference potential (Hight) or the reference potential (Low).

When the potential of the capacitance element 51 exceeds the threshold potential of the buffer circuit 56, the buffer circuit 56 outputs a comparison start signal. The comparison start signal output from the buffer circuit 56 is input to the charge/discharge switch 52a as a discharge instruction signal and is also input to the conversion data generator 40 as a completion signal.

When a discharge instruction signal is input from the buffer circuit 56, the charge switch 521a is turned off and the discharge switch 522 is turned on to start discharging from the capacitance element 51, and when the potential of the capacitance element 51 falls below the threshold potential of the inverter circuit 54 due to the discharge, the inverter circuit 54 outputs a comparison start signal. The comparison start signal output from the inverter circuit 54 is input to the charge/discharge switch 52a as a charge instruction signal and is also input to the conversion data generator 40 as a completion signal.

Hereafter, the comparison start signal is output at the time quantized by repetition, and the conversion data generator 40 outputs an output switching instruction signal to the output switching circuit 55a at a desired timing by counting the input completion signals, and turns on either of connection switches $551_1$ or $551_2$ of the output switching circuit 55 to output a comparison start signal to the comparator 3.

Therefore, a fourth variant of the comparator operation signal generation circuit 5 illustrated in FIG. 6 allows a generation circuit 502 to predict each settling time of the capacitance DAC 2, which is different for each bit to be switched, and to output a comparison start signal to the comparator 3 at the time when the settling time ends.

As explained above, one or more embodiments may be a successive approximation type A/D converter 10 that converts an analog input to a digital converter value by repeating a conversion data generation operation by the conversion data generator 40, a potential generation operation by the capacitance DAC 2, and a comparison operation by the comparator 3 for a resolution bit. The successive approximation type A/D converter 10 comprises the comparator operation signal generation circuit 5, which predicts the time when the potential generated by the capacitance DAC 2 is settled based on the charge/discharge time to the capacitance element 51 having the same characteristics as the capacitance $C_0$ to $C_{(n-1)}$ used in the capacitance DAC 2, and generates a comparator operation signal to cause the comparator 3 to start the comparison operation.

This configuration, by using the capacitance element 51 having the same characteristics as the capacitance used in the capacitance DAC 2, may predict the truly necessary [capacitance DAC settling time] and eliminate excessive [capacitance DAC settling time] allocation to achieve higher speeds.

In one or more embodiments, the comparator operation signal generation circuits 5 and 5a predict the settling time of the capacitance DAC 2, which is different for each bit to be switched, based on each discharge time of the capacitance elements 51 charged with the plurality of injection potential (n−1) to injection potential (0).

In one or more embodiments, the comparator operation signal generation circuits 5b and 5c predict the settling time of the capacitance DAC 2, which is different for each bit to be switched, by repeating the discharge time of the capacitance element 51 charged with the injection potential. This configuration allows prediction of the [capacitance DAC settling time] without preparing a plurality of injection potentials.

In one or more embodiments, the capacitance element 51 is discharged via the discharge switch 522, and the discharge switch 522 has an on-resistance equivalent to the on-resistance of the switches $22_0$ to $22_{(n)}$ when the capacitance $C_0$ to $C_{(n-1)}$ is connected to the reference potential (Hight) or the reference potential (Low). With this configuration, the settling time may be predicted more accurately.

In one or more embodiments, the comparator operation signal generation circuit 5d predicts the settling time of the capacitance DAC 2, which is different for each bit to be switched, by repeating the charging time of charging the capacitance element 51 with the injection potential and the discharging time of the capacitance element 51 charged with the injection potential. This configuration allows prediction of the [capacitance DAC settling time] by using only one capacitance element 51.

In the present embodiment, the capacitance element 51 is charged and discharged via the charge switch 521a and the discharge switch 522, respectively. The charge switch 521a and the discharge switch 522 have on-resistance equivalent to the on-resistance of the switches $22_0$ to $22_{(n-1)}$ when the capacitance $C_0$ to $C_{(n-1)}$ is connected to the reference potential (Hight) or the reference potential (Low). With this configuration, the settling time may be predicted more accurately.

The present invention may not be limited to the above-described embodiments, and that each embodiment may be changed as appropriate within the scope of the technical concept of the present invention. The number, position, shape, etc. of the above-described components are not limited to the above-described embodiments, and may be made into a number, position, shape, etc. suitable for implementing the present invention. The same sign is assigned to the same component in each figure.

As explained above, an A/D converter according to one or more embodiments may predict the truly necessary [capacitance DAC settling time] by using the capacitance element 51 having the same characteristics as the capacitance used in the capacitance DAC 2, and may eliminate the allocation of excessive [capacitance DAC settling time] to achieve higher speeds.

The invention claimed is:

1. An analog-to-digital converter that converts an analog input to a digital converted value by repeating a conversion data generation operation by a conversion data generator, a potential generation operation by a capacitance DAC, and a comparison operation by a comparator for a resolution bit, the analog-to-digital converter comprising
a comparator operation signal generation circuit that predicts the time when a potential generated by the capacitance DAC becomes settled based on a charging or discharging time to a capacitance element whose characteristics are equal to those of the capacitance used in the capacitance DAC, and generates a comparator operation signal to allow the comparator to start the comparison operation, wherein the comparator operation signal generation circuit predicts settling time of the capacitance DAC, which is different for each bit to be switched, based on each discharging time of the capacitance element charged with injection potentials.

2. The analog-to digital converter according to claim 1, wherein analog-to digital converter comprises a successive approximation type analog-to-digital converter.

3. An analog-to-digital converter that converts an analog input to a digital converted value by repeating a conversion data generation operation by a conversion data generator, a potential generation operation by a capacitance DAC, and a comparison operation by a comparator for a resolution bit, the analog-to-digital converter comprising a comparator operation signal generation circuit that predicts the time when a potential generated by the capacitance DAC becomes settled based on a charging or discharging time to a capacitance element whose characteristics are equal to those of the capacitance used in the capacitance DAC, and generates a comparator operation signal to allow the comparator to start the comparison operation, wherein the comparator operation signal generation circuit predicts settling time of the capacitance DAC, which is different for each bit to be switched, by repeating discharging time of the capacitance element charged with an injection potential.

4. The analog-to-digital converter according to claim 2, wherein the capacitance element is discharged via a discharge switch; and the discharge switch has an on-resistance equivalent to the on-resistance of a switch connecting the capacitance used in the capacitance DAC to a reference potential (Hight) or a reference potential (Low).

5. An analog-to-digital converter that converts an analog input to a digital converted value by repeating a conversion data generation operation by a conversion data generator, a potential generation operation by a capacitance DAC, and a comparison operation by a comparator for a resolution bit, the analog-to-digital converter comprising a comparator operation signal generation circuit that predicts the time when a potential generated by the capacitance DAC becomes settled based on a charging or discharging time to a capacitance element whose characteristics are equal to those of the capacitance used in the capacitance DAC, and generates a comparator operation signal to allow the comparator to start the comparison operation, wherein the comparator operation signal generation circuit predicts settling time of the capacitance DAC, which is different for each bit to be switched, by repeating a charging time to charge the capacitance element with an injection potential and a discharging time of the capacitance element charged with the injection potential.

6. The analog-to-digital converter according to claim 5, wherein the capacitance element is charged and discharged via a charge switch and a discharge switch, respectively; and the charge switch and the discharge switch have on-resistance equivalent to the on-resistance of a switch connecting the capacitance used in the capacitance DAC to the reference potential (Hight) or the reference potential (Low).

7. An analog-to-digital converter comprising a capacitance DAC comprising a capacitance and switches, the capacitance DAC receiving an analog input potential, a first reference potential, and a second reference potential, and generating a comparison potential;

a comparator that compares the comparison potential generated by the capacitance DAC with a reference potential, and outputs a comparison result signal according to a comparison operation signal;

a conversion data generator that receives the comparison signal output by the comparator, and generates a conversion data; and a comparator operation signal generation circuit comprising a capacitance element whose characteristics are substantially equal to the capacitance of the capacitance DAC;

an injection potential output unit that outputs one of injection potentials based on a charge/discharge instruction signal;

a potential switching circuit that switches and outputs one of the injection potentials based on a charge/discharge instruction signal;

a charge/discharge switch controlling charging and discharging the potential output by the potential switching circuit to the capacitance element; and an inverter circuit that outputs the comparison operation signal in response to a detection of charging and discharging of the capacitance element.

8. The analog-to-digital converter according to claim 7, wherein the analog-to-digital converter comprises a plurality of comparator operation signal generation circuits, wherein each of the injection potential output unit outputs an injection potential based on a charge/discharge instruction signal, each of the potential switching circuit switches and outputs injection potential based on a charge/discharge instruction signal; wherein one of the comparator operation signal generation circuits outputs the comparison operation signal in response to the detection of charging and discharging of the capacitance element.

9. The analog-to-digital converter according to claim 8, wherein the plurality of comparator operating signal generation circuits are connected in series.

10. The analog-to-digital converter according to claim 9, wherein the output of a final comparator operation signal generation circuit connected in series is fed back to a first comparator operation signal generation circuit connected in series.

11. The analog-to-digital converter according to claim 9, wherein the comparator operation signal generation circuit further comprises:

a buffer circuit that has a threshold value different from that of the inverter circuit and outputs a second comparison operation signal in response to the detection of charging and discharging of the capacitance element; and an output switching circuit that outputs one of the comparison operation signal output by the inverter circuit and the second comparison operation signal output by the buffer circuit.

* * * * *